US006177848B1

(12) United States Patent
Hopkinson et al.

(10) Patent No.: US 6,177,848 B1
(45) **Date of Patent: *Jan. 23, 2001**

(54) HIGH FREQUENCY SNUBBER FOR TRANSFORMERS

(75) Inventors: Philip J. Hopkinson, Charlotte, NC (US); Richard R. Rettew, Fort Mill, SC (US)

(73) Assignee: Square D Company, Palatine, IL (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/223,612

(22) Filed: Dec. 30, 1998

(51) Int. Cl.[7] .................................................... H03H 7/06

(52) U.S. Cl. ......................... 333/172; 333/177; 333/185; 336/70

(58) Field of Search .................................... 333/172, 177, 333/181, 185; 336/70; 361/38; 338/267, 270, 297–301

(56) References Cited

U.S. PATENT DOCUMENTS

| | | | |
|---|---|---|---|
| 3,146,417 | 8/1964 | Pearson | 336/69 |
| 3,982,814 * | 9/1976 | Kaiserswerth et al. | 333/181 X |
| 4,090,227 | 5/1978 | Schweitzer | 361/57 |
| 4,153,891 | 5/1979 | McNutt | 336/70 |
| 4,334,254 | 6/1982 | Baker et al. | 361/9 |
| 4,760,486 | 7/1988 | Beeken et al. | 361/56 |
| 5,005,100 | 4/1991 | Owen | 361/35 |
| 5,130,880 | 7/1992 | Puri | 361/35 |
| 5,216,356 | 6/1993 | Owen | 323/361 |
| 5,323,304 | 6/1994 | Woodworth | 363/47 |
| 5,764,123 | 6/1998 | Waters | 336/84 R |
| 5,770,992 | 6/1998 | Waters | 336/84 R |

OTHER PUBLICATIONS

*Electrical Transients in Power Systems*; Second Edition; Allan Greenwood; Rensselaer Polytechnic Institute; "Modeling Power Apparatus and the Behavior of such Equipment under Transient Conditions" –pp. 322–384, 1991.

*Transformer Engineering*; A Treatise on the Theory, Operation, and Application of Transformers; The late L.F. Blume, A. Boyajian, G. Camilli, T.C. Lennox, S. Minneci, V.M. Montsinger; All of the Engineering Division of the General Electric Company, Pittsfield, Massachusetts; Second Edition; "Transient Voltage Characteristics of Transformers"; pp. 463–500, 1951.

* cited by examiner

*Primary Examiner*—Justin P. Bettendorf
(74) *Attorney, Agent, or Firm*—Michael J. Femal; Larry I. Golden

(57) ABSTRACT

The present invention relates to a transformer comprising a coil having an insulated wire formed into a plurality of turns defining a layer and a resistive element wrapped around the outer surface of the layer. The resistive element couples one of the plurality of turns with another of the plurality of turns. The resistive element not only increases the series capacitance of the transformer, but also increases the series conductance of the transformer circuit. The increase in the series resistance increases the dampening of the switching resonance.

24 Claims, 2 Drawing Sheets

HIGH FREQUENCY SNUBBER FOR TRANSFORMERS

DESCRIPTION

1. Technical Field

The present invention relates generally to the protection of transformers. More particularly, the present invention relates to the protection of transformers in which voltage transients, such as voltage surges created when switching the transformer on and off, are dampened so that the transients do not damage the transformer.

2. Background of the Invention

Power transformers and other wire-wound devices have been known to fail by a phenomena called "switching resonance." For example, a circuit breaker connecting a power transformer to a power source may go through a state known as multiple re-ignitions as the power transformer is switched on or off. The multiple re-ignitions may last for less than 10 microseconds. During this short period of time, the re-ignition rate of the circuit breaker may be on the order of 10 to 10,000 kilohertz. The rapid re-ignitions cause the coils of the transformer to develop resonance at these frequencies. At these very high frequencies, very high voltages can be induced between the turns of the transformer coils. The large voltages can arise when some type of switching occurs in the network.

One method used to prevent the harmonic effects of voltage transients is to attempt to restrict harmonic currents by the use of low pass filters or high frequency traps. These filters are configured to become increasingly conductive as frequency increases. They shunt high frequency disturbances to ground and dissipate the energy. Further, the switching resonance problem typically occurs deep in the center of the windings where normal means of over-voltage suppression become very difficult and impractical. Although the use of external RC networks have been successfully used to control these events, these devices require a significant economic investment.

Various electrostatic shielding techniques have also been used to control the magnitude of internal voltage oscillations. The shielding consists of a metal foil, and is heavily insulated from the coil and from surrounding structural parts at ground potential. The shielding is electrically connected to the line terminal of the coil. The electrostatic shield adds series capacitance to the circuit, thus minimizing the magnitude of the high frequency oscillations. The resonance of the oscillations, however, is not dampened by the electrostatic shield. In addition, although the electrostatic shield adds series capacitance to the outer layer of turns, no series capacitance is directly added to the inner layers of turns.

SUMMARY OF THE INVENTION

The present invention is directed to a transformer comprising a coil and a resistive element. The coil has an insulated wire formed into a plurality of adjacent turns defining a layer. The resistive element couples one of the plurality of turns with another of the plurality of turns. The resistive element adds both series capacitance and series resistance to the transformer circuit, thereby minimizing the magnitude of the high frequency oscillations as well as dampening the resonance of the oscillations.

DETAILED DESCRIPTION

Figure 1:
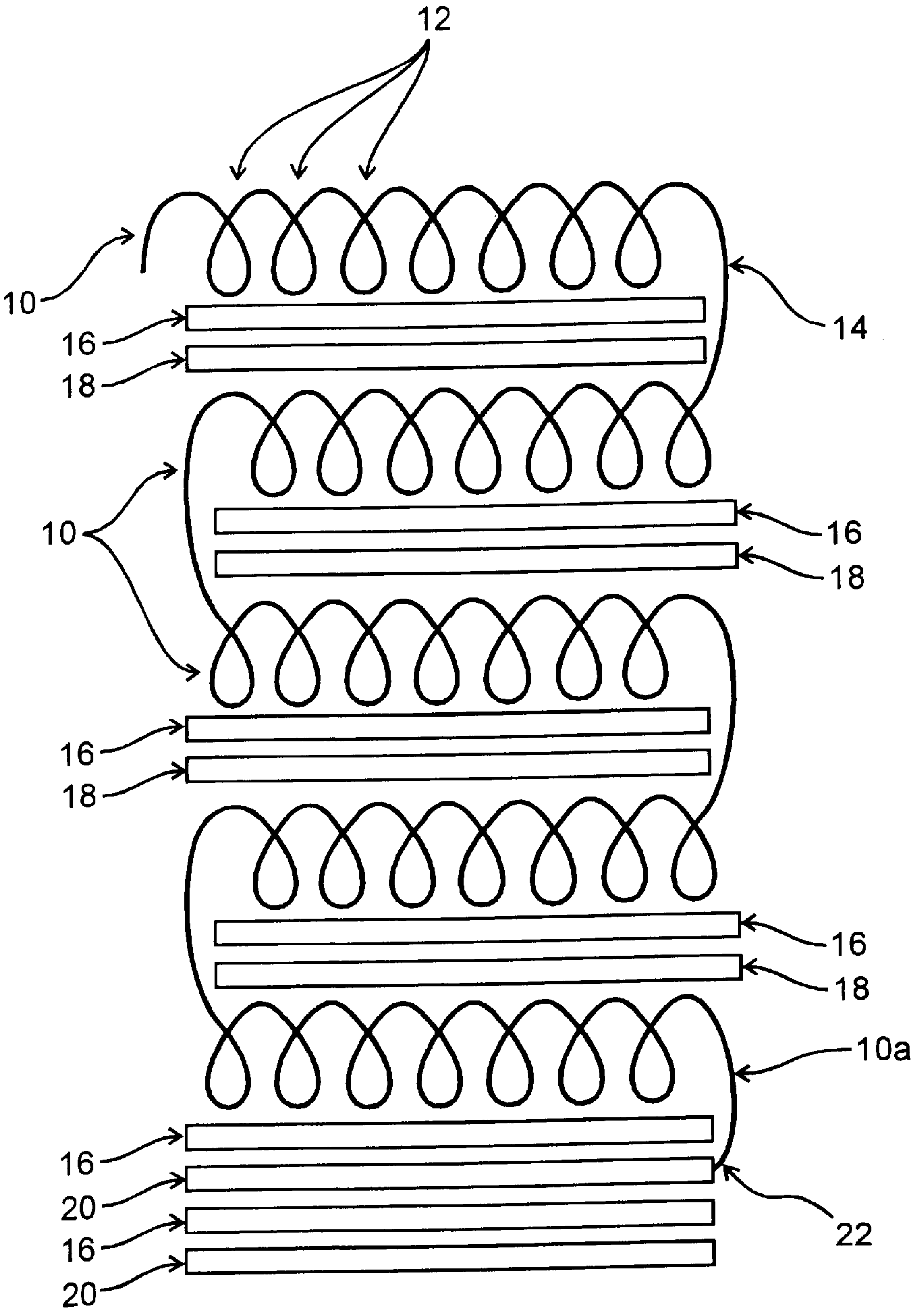
FIG. 1 depicts the layers of turn in a coil in accordance with the present invention.

While this invention is susceptible of embodiment in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

Conventional transformers comprise a primary coil and at least one secondary coil. Current through the primary coil produces a magnetic field which induces a voltage across the secondary coil. Both the primary and secondary coils have a length of insulated wire formed into a plurality of adjacent turns defining a layer. As is well known, many layers of adjacent turns separated by insulation typically form the coils.

Figure 2:
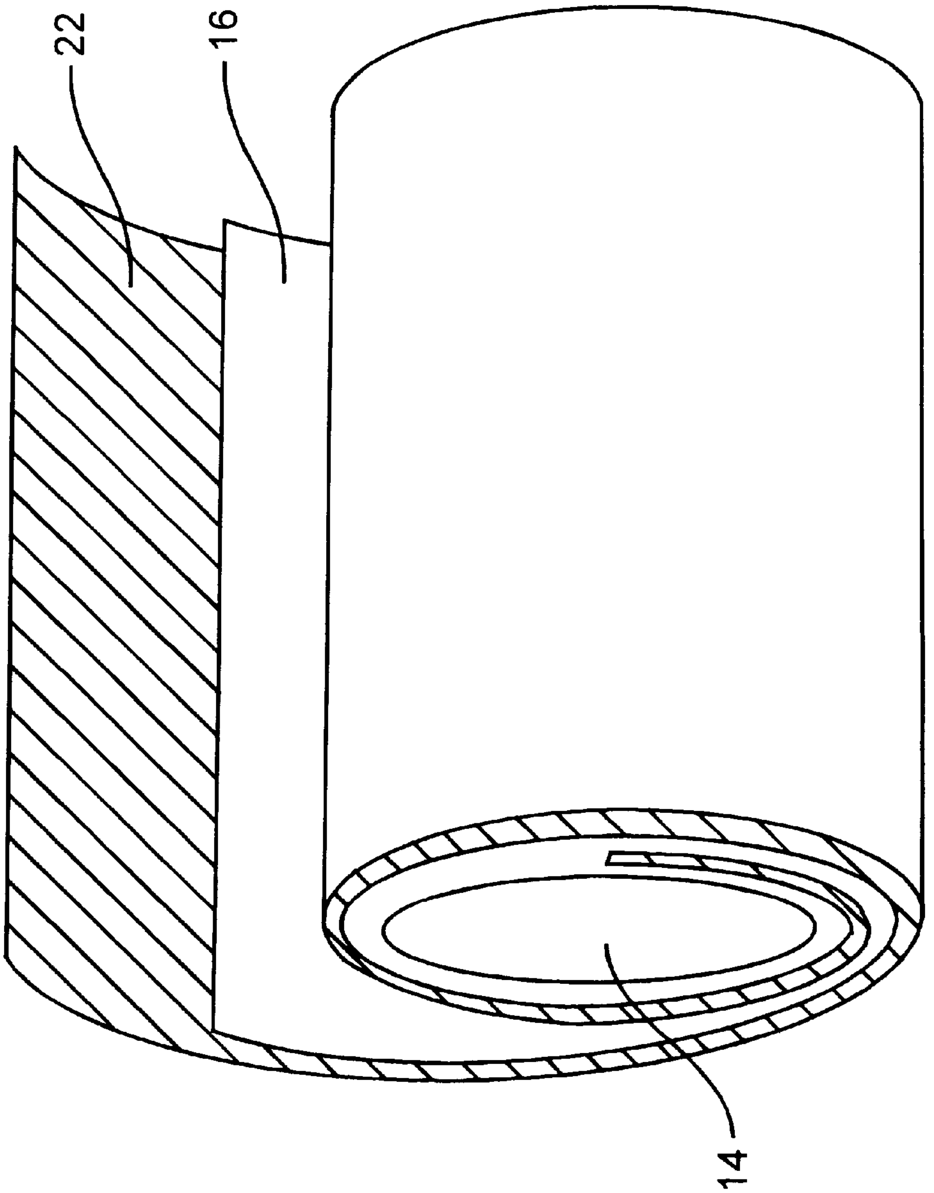
FIG. 2 is a perspective view showing multiple turns of a shielding and resistive material around a coil in accordance with the present invention.

FIG. 1 depicts the layers 10 of turn 12 in a coil 14 in accordance with the present invention. A layer of resistive material 16 and an insulation layer 18 separate two adjacent layers 10 of turns 12 on the coil 14. The outer layer 10*a* of adjacent turns 12 in the coil 14 is wrapped with the resistive material 16 and surrounded by a shielding 20 consisting of a metal foil connected to the high voltage line end 22 of the coil 14. A small slot (not shown) separates the ends of the shielding 20 to prevent a short across the shielding 20. The foil 20 acts as a high frequency short to minimize high frequency oscillations. The resistive material 16 and shielding 20 may wrap around the coil 14 a number of times, as shown in FIG. 2.

The resistive material 16 has a resistance between adjacent turns 12 from 10 ohms to 1000 ohms. Preferably, the resistive material 16 comprises carbon paper, glass cloth or a film insulation sheet material, such as a product trademarked NOMEX. The resistive material 16 couples one of the plurality of turns 12 with another of the plurality of turns 12.

The resistive material 16 forms an electrical connection between the outer surfaces of the insulated wires in a given layer 10. A small continuous RC network is thus formed between each turn 12 in the coil 14. Specifically, the wire of one turn 12 forms a plate of a first capacitor, the insulating material 18 of that turn 12 forms the dielectric for the first capacitor, and the resistive material 16 on the surface of that turn 12 becomes the second plate of the first capacitor. The resistive material 16 also forms a resistor and the first plate for a second capacitor with the insulating material 18 and the wire of the second turn 12 forming the dielectric and the second plate of the second capacitor, respectively. The electrical equivalent of this circuit would be a capacitor, a resistor and a second capacitor all in series between the turns 12 in a layer 10 of the coil 14. Accordingly, the resistive material 16 not only increases the series capacitance of the transformer circuit, but also increases the series conductance of the transformer circuit across the layer 10 of the transformer winding. The increase in the series conductance increases the dampening of the switching resonance.

Not only can RC network currents flow perpendicularly through the resistive material 16, as described above, but current also flows longitudinally along the length of the wire in a given layer 10. Also, the resistive material 16 can more evenly distribute dielectric stress within the insulating material 18. Abrupt changes in dielectric materials having differing dielectric constants can have an adverse effect on the dielectric materials in contact with each other as a result of high dielectric stress levels. The resistive material 16 will distribute any concentrated stress levels which may develop in the winding process.

At power frequencies, the current flow in any direction through the resistive material 16 would be small because of the relatively high capacitive reactance, or impedance, across the dielectric of the insulation material 18. At high frequencies, however, the capacitive reactance of the insulation material 18 becomes low and the resistive material 16 becomes connected to each wire. This causes the energy of the transient to be absorbed by the resistive material 16 which transforms the energy into heat which is dissipated over time. This energy dissipation dampens the resonant activity of the coil 14 preventing high voltages between turns. Thus, the transformer is self-protecting.

The multiple turns of the shielding 20 and the resistive material 16 form a secondary winding to the coil 14. Accordingly, a voltage is induced across the shielding 20 which is proportional to the number of turns in the shielding 20. Specifically, the voltage of the shielding 20 is equal to the product of the number of turns in the shielding 20 and the voltage across the coil 14 divided by the number of the turns in the coil 14. Due to the voltage differential between adjacent layers of foil 20, energy is discharged through the resistive material 16 between the adjacent layers of foil 20.

While the specific embodiments have been illustrated and described, numerous modifications come to mind without significantly departing from the spirit of the invention and the scope of protection is only limited by the scope of the accompanying claims.

We claim:

1. A transformer comprising:

a plurality of coils, including one primary coil and at least one secondary coil;

at least one of said plurality of coils having an insulated wire formed into a plurality of adjacent turns defining a layer, said layer having an outer surface;

a resistive element coupling one of the plurality of turns with another of the plurality of turns;

an insulating element positioned between the resistive element and the plurality of turns, the insulating element being conductive at high frequencies and resistive at low frequencies; and wherein said resistive element coupling one of the plurality of turns with another of the plurality of turns forms a series resistor-capacitor network between adjacent layers of the at least one of said plurality of coils.

2. The transformer of claim 1 wherein said resistive element wraps around the outer surface of said layer.

3. The transformer of claim 1 wherein said at least one of said plurality of coils is a primary coil.

4. The transformer of claim 1 wherein said at least one of said plurality of coils is a secondary coil.

5. The transformer of claim 1 wherein the resistive element has a resistance between adjacent turns from 10 ohms to 1000 ohms.

6. The transformer of claim 1 wherein said resistive element comprises carbon paper.

7. The transformer of claim 1 wherein said resistive element comprises glass cloth.

8. The transformer of claim 1 wherein said resistive element comprises a film insulation sheet material.

9. A transformer comprising:

a plurality of coils, including one primary coil and at least one secondary coil;

at least one of said plurality of coils having an insulated wire formed into a plurality of adjacent turns, said at least one of said plurality of coils having an outer surface and a resistive element wrapped around the outer surface of said coil;

an insulating element positioned between the resistive element and the plurality of turns, the insulating element being conductive at high frequencies and resistive at low frequencies; and wherein said at least one of said plurality of coils further includes a foil shield surrounding said resistive element to form a series resistor-capacitor network between said outer surface and the foil shield of the at least one of said plurality of coils.

10. The transformer of claim 9 wherein said at least one of said plurality of coils is a primary coil.

11. The transformer of claim 9 wherein said at least one of said plurality of coils is a secondary coil.

12. The transformer of claim 9 wherein the resistive element has a resistance between adjacent turns from 10 ohms to 1000 ohms.

13. The transformer of claim 9 wherein said resistive element comprises carbon paper.

14. The transformer of claim 9 wherein said resistive element comprises glass cloth.

15. The transformer of claim 9 wherein said resistive element comprises a film insulation sheet material.

16. The transformer of claim 9 said foil surrounding said resistive element is connected to a high voltage line end of said at least one of said plurality of coils.

17. The transformer of claim 16 wherein said resistive element and said foil wrap around said at least one of said plurality of coils at least twice.

18. A transformer comprising:

a plurality of coils, including one primary coil and at least one secondary coil;

at least one of said plurality of coils having an insulated wire formed into a plurality of adjacent turns defining a number of consecutive layers and a resistive element between the consecutive layers of said coil;

an insulating element positioned between the resistive element and the plurality of turns, the insulating element being conductive at high frequencies and resistive at low frequencies; and wherein said resistive element between the consecutive layers forms a series resistor-capacitor network between the consecutive layers of the at least one of said plurality of coils.

19. The transformer of claim 18 wherein the resistive element has a resistance between adjacent turns from 10 ohms to 1000 ohms.

20. The transformer of claim 18 wherein said resistive element comprises carbon paper.

21. The transformer of claim 18 wherein said resistive element comprises glass cloth.

22. The transformer of claim 18 wherein said resistive element comprises a film insulation sheet material.

23. A transformer comprising:

a plurality of coils, including one primary coil and at least one secondary coil;

at least one of said plurality of coils having an insulated wire formed into a plurality of adjacent turns, said at least one of said plurality of coils having an outer surface and a resistive element wrapped around the outer surface of said coil;

wherein said at least one of said plurality of coils further includes a foil shield surrounding said resistive element to form a series resistor-capacitor network between said outer surface and the foil shield of the at least one of said plurality of coils;

wherein said foil shield surrounding said resistive element is connected to a high voltage line end of said at least one of said plurality of coils.

24. A transformer comprising:

a plurality of coils, including one primary coil and at least one secondary coil;

at least one of said plurality of coils having an insulated wire formed into a plurality of adjacent turns, said at least one of said plurality of coils having an outer surface and a resistive element wrapped around the outer surface of said coil;

wherein said at least one of said plurality of coils further includes a foil shield surrounding said resistive element to form a series resistor-capacitor network between said outer surface and the foil shield of the at least one of said plurality of coils;

wherein said foil shield surrounding said resistive element is connected to a high voltage line end of said at least one of said plurality of coils; and wherein said resistive element and said foil shield wrap around said primary coil at least twice.

* * * * *